United States Patent
Zhang et al.

(10) Patent No.: US 11,912,729 B2
(45) Date of Patent: Feb. 27, 2024

(54) COMPOUND, DISPLAY PANEL AND DISPLAY APPARATUS

(71) Applicants: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

(72) Inventors: Lei Zhang, Shanghai (CN); Wei Gao, Shanghai (CN); Jinghua Niu, Shanghai (CN); Ying Liu, Shanghai (CN); Dongyang Deng, Shanghai (CN); Yan Lu, Shanghai (CN); Hongyan Zhu, Shanghai (CN); Xia Li, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 761 days.

(21) Appl. No.: 17/003,951

(22) Filed: Aug. 26, 2020

(65) Prior Publication Data

US 2020/0392165 A1    Dec. 17, 2020

(30) Foreign Application Priority Data

Jun. 30, 2020 (CN) .......................... 202010622200.6

(51) Int. Cl.
*C07F 7/08* (2006.01)
*H10K 85/40* (2023.01)
*H10K 85/60* (2023.01)

(52) U.S. Cl.
CPC .......... *C07F 7/0803* (2013.01); *H10K 85/40* (2023.02); *H10K 85/622* (2023.02);
(Continued)

(58) Field of Classification Search
CPC ............. H10K 85/6574; H10K 85/622; H10K 85/6576; H10K 85/6572; H10K 85/40;
(Continued)

(56) References Cited

FOREIGN PATENT DOCUMENTS

| CN | 108948030 A | 12/2018 |
| WO | 2017118209 A1 | 7/2017 |
| WO | WO-2020138964 A1 * | 7/2020 ............. C07F 5/027 |

OTHER PUBLICATIONS

Geum et al., machine translation of WO-2020138964-A1 (2020) pp. 1-50. (Year: 2020).*

* cited by examiner

*Primary Examiner* — Dylan C Kershner
(74) *Attorney, Agent, or Firm* — KILPATRICK TOWNSEND & STOCKTON LLP

(57) ABSTRACT

Provided are a boron-silicon heterocyclic compound having a structure represented by formula 1, a display device and a display apparatus. In formula 1, $L_1$ and $L_2$ are each a single bond, C6-C30 arylene, C6-C30 fused arylene, C4-C30 heteroarylene, or C4-C30 fused heteroarylene; $D_1$ and $D_2$ are each a substituted or unsubstituted C6-C60 aryl, a substituted or unsubstituted C4-C60 heteroaryl, a substituted or unsubstituted C10-C60 fused aryl, a substituted or unsubstituted C8-C30 fused heteroaryl, or a substituted or unsubstituted diphenylamino. The compound has a strong inductive effect and can reduce the driving voltage of the device. The silacyclopentadiene having a silicon atom as spiro-atom can effectively improve the solubility of the material, which (Continued)

is beneficial to the cleaning of the vapor deposition mask. In addition, the compound has a higher triplet energy level to effectively transfer energy to the luminous body, and improves the efficiency of the device.

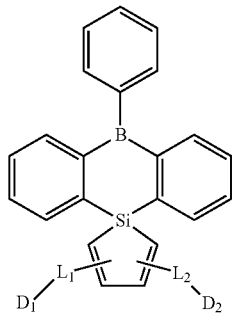

20 Claims, 2 Drawing Sheets

(52) U.S. Cl.
CPC ..... *H10K 85/6572* (2023.02); *H10K 85/6574* (2023.02); *H10K 85/6576* (2023.02)
(58) Field of Classification Search
CPC .... H10K 85/322; H10K 85/658; C07F 5/027; C07F 7/0803; C07F 7/0807; H01L 51/008; H01L 51/0094
See application file for complete search history.

COMPOUND, DISPLAY PANEL AND DISPLAY APPARATUS

CROSS-REFERENCE TO RELATED APPLICATION

The present application claims priority to Chinese Patent Application No. 202010622200.6, filed on Jun. 30, 2020, the content of which is incorporated herein by reference in its entirety.

FIELD

The present disclosure relates to the field of organic electroluminescent materials, and particularly, to a boron silicon heterocyclic compound, and a display panel including the compound, and a display apparatus.

BACKGROUND

As a new generation of display technology, organic electroluminescent materials, such as organic light-emitting diodes (OLED) have been widely used in flat-panel displays, flexible displays, solid-state lighting and vehicle displays, due to their advantageous such as ultra-thin, self-luminousity, wide viewing angle, fast response, high light-emitting efficiency, good temperature adaptability, simple manufacturing process, low driving voltage and energy consumption, and the like.

Particularly, in recent years, the smart phone industry has increasing demand for OLEDs, which promotes the research and applications of light-emitting materials of OLEDs.

The light emitted by OLEDs can be classified into electrofluorescence and electrophosphorescence depending upon the luminescence mechanism. Fluorescence is a result of a radiation attenuation transition of singlet excitons, and phosphorescence is a result of light emitted during attenuation transition to the ground state of triplet excitons. According to the spin-statistics theory, a ratio of a forming probability of singlet excitons to a forming probability of triplet excitons is 1:3. The internal quantum efficiency of the electrofluorescent material is no more than 25%, and the external quantum efficiency is generally less than 5%. Theoretically, the internal quantum efficiency of the electrophosphorescent material can reach 100%, and the external quantum efficiency can be up to 20%. In 1998, Professor Yuguang Ma from Jilin University in China and Professor Forrest from Princeton University in the United States both reported that ruthenium complexes and platinum complexes were used as dyes doped into the light-emitting layer, a phenomenon of electrophosphorescence was first explained, and applied the prepared phosphorescent material to electroluminescent devices.

The long lifetime (μs) of phosphorescent heavy metal materials may lead to triplet state-triplet state quenching and concentration quenching at high current densities and further result in a degradation of device performance. Therefore, phosphorescent heavy metal materials are usually doped into suitable host materials to form a host-guest doping system, optimizing the energy transfer and increasing the light-emitting efficiency and lifetime. At present, the heavy metal doping materials have been commercialized. However, it has been has proven challenging to develop alternative doping materials. It becomes urgent to develop a novel phosphorescent host material.

SUMMARY

In view of the above, the present disclosure provides a compound having a structure represented by formula 1:

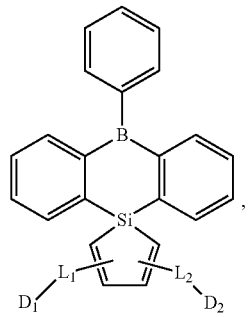

formula I and $L_1$ and $L_2$ are each independently selected from the group consisting of a single bond, C6-C30 arylene, C6-C30 fused arylene, C4-C30 heteroarylene, and C4-C30 fused heteroarylene; and $D_1$ and $D_2$ are each independently selected from the group consisting of a substituted or unsubstituted C6-C60 aryl, a substituted or unsubstituted C4-C60 heteroaryl, a substituted or unsubstituted C10-C60 fused aryl, a substituted or unsubstituted C8-C30 fused heteroaryl, and a substituted or unsubstituted diphenylamino.

The present disclosure also provides a display panel, including an organic light-emitting device. The organic light-emitting device includes an anode, a cathode, and a light-emitting layer disposed between the anode and the cathode. A light-emitting host material or a light-emitting guest material of the light-emitting layer is one or more selected from the compounds according to the present disclosure.

The present disclosure further provides a display apparatus including the display panel according to the present disclosure.

DESCRIPTION OF EMBODIMENTS

Figure 1:
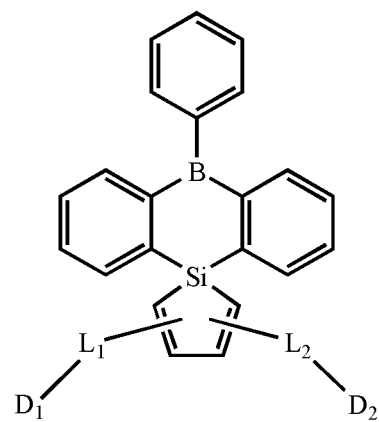
FIG. 1 is a chemical formula of a compound according to the present disclosure.

In one embodiment, the present disclosure provides a compound having a structure represented by formula 1:

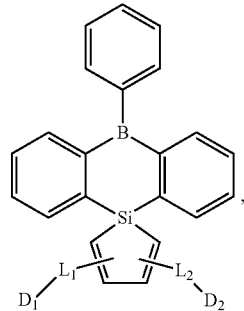

formula I and $L_1$ and $L_2$ are each independently selected from the group consisting of a single bond, C6-C30 arylene, C6-C30 fused arylene, C4-C30 heteroarylene, and C4-C30 fused heteroarylene; and $D_1$ and $D_2$ are each independently selected from the group consisting of a substituted or unsubstituted C6-C60 aryl, a substituted or unsubstituted C4-C60 heteroaryl, a substituted or unsubstituted C10-C60 fused aryl, a substituted or unsubstituted C8-C30 fused heteroaryl, and a substituted or unsubstituted diphenylamino.

In the compound provided by the present disclosure, the heteroanthracyl containing boron and silicon has a strong inductive effect to enhance the injection and transmission of electrons, and can lower a driving voltage of the device. The silacyclopentadiene having a silicon atom as spiro-atom can effectively improve the solubility of the material and facilitate the cleaning of a mask for vapor deposition. In addition, the compound of the present disclosure has a higher triplet energy level, which effectively transfers energy to luminous body and improves the efficiency of the device.

The compound of the present disclosure has a high glass transition temperature and high thermal stability, and thus can easily form a good amorphous film, reducing the driving voltage and improving the luminous efficiency and lifetime of the device. In this way, the compound is suitable to be applied in the technical field of electroluminescence, as a light-emitting host material or an electron transmission material.

In the compound of the present disclosure, in addition to the strong inductive effect, the heteroanthracyl containing boron and silicon has a strong electron-accepting ability, and thus can effectively adjust a HOMO energy level of the compound of the present disclosure in combination with different D1 and D2 groups, to adapt to different hole or electron transmission layers adjacent thereto and light-emitting doping material systems. Thus, the compound can satisfy different mass production requirements of the devices to the greatest extent. Moreover, the different D1 and D2 groups of the compound according to the present disclosure have simple and stable structures and are fragments that are commonly used in mass-produced and have relatively low price, effectively saving materials and device manufacturing costs.

In an embodiment of the compound of the present disclosure, $L_1$ and $L_2$ are each independently any one of the following groups:

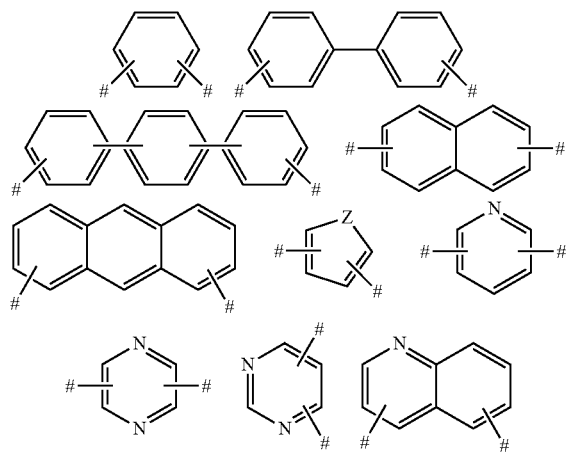

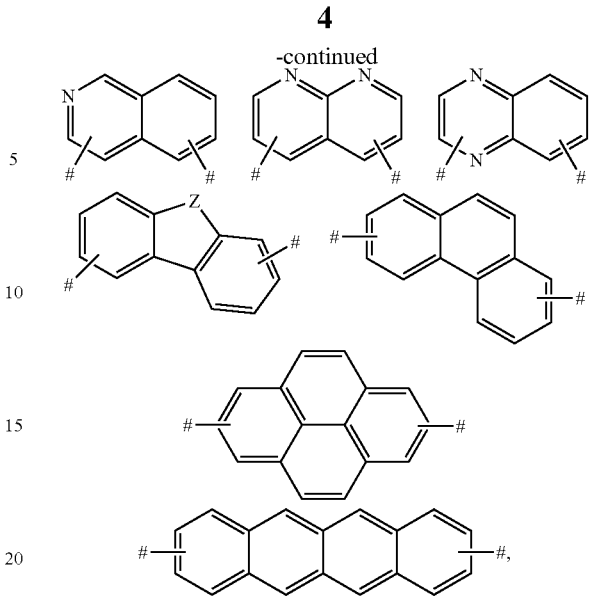

in which, Z is O, S, or NH; and
# represents a bonding position.

In an embodiment of the compound of the present disclosure, $L_1$ and $L_2$ are identical.

In an embodiment of the compound of the present disclosure, $D_1$ and $D_2$ are identical.

In an embodiment of the compound of the present disclosure, $D_1$ and $D_2$ are each independently selected from the group consisting of a substituted or unsubstituted phenyl, a substituted or unsubstituted biphenyl, a substituted or unsubstituted naphthyl, a substituted or unsubstituted anthracyl, a substituted or unsubstituted phenanthracyl, a substituted or unsubstituted acenaphthylenyl, a substituted or unsubstituted pyrenyl, a substituted or unsubstituted perylenyl, a substituted or unsubstituted fluorenyl, a substituted or unsubstituted spirobifluorenyl, a substituted or unsubstituted chrysenyl, a substituted or unsubstituted benzophenanthracyl, a substituted or unsubstituted benzoanthracyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, carbazolyl and a carbazole-derived group, acridinyl and an acridine-derived group, and diarylamino and a diarylamine-derived group.

In an embodiment of the compound of the present disclosure, $D_1$ and $D_2$ are each independently a group represented by:

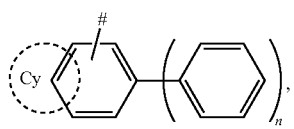

and Cy is present or absent, and
when Cy is present, Cy is an aromatic ring or an aromatic fused ring;
n is 0, 1, or 2; and
# represents a bonding position.

In an embodiment of the compound of the present disclosure, $D_1$ and $D_2$ are each independently a group represented by:

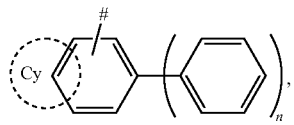

and Cy is a benzene ring, a naphthalene ring, or a phenanthrene ring.

In an embodiment of the compound of the present disclosure, $D_1$ and $D_2$ are each independently any one of the following groups:

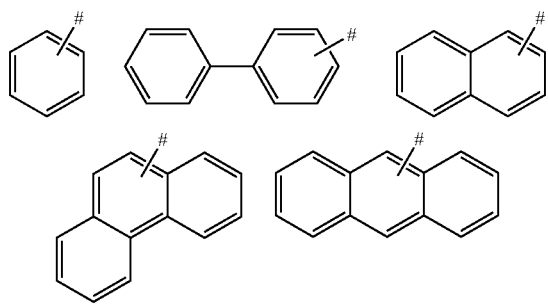

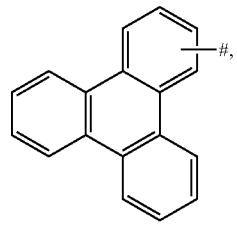

in which # represents a bonding position.

In an embodiment of the compound of the present disclosure, $D_1$ and $D_2$ are each independently a group represented by:

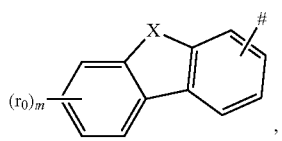

and X is selected from the group consisting of O, S, N-$r_{01}$ and C($r_{02}r_{03}$), and $r_0$, $r_{01}$, $r_{02}$ and $r_{03}$ are each independently selected from the group consisting of H, C1-C6 alkyl, C1-C6 alkoxy, and C6-C12 aryl;

m is 0, 1, or 2; and # represents a bonding position.

In an embodiment of the compound of the present disclosure, $D_1$ and $D_2$ are each independently any one of the following groups:

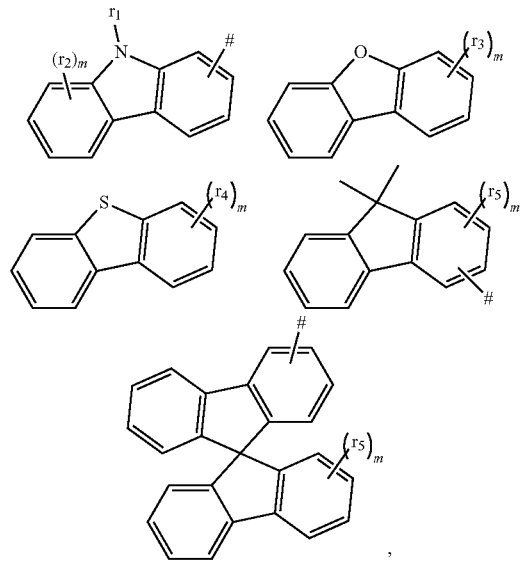

and $r_1$, $r_2$, $r_3$, $r_4$ and $r_5$ are each independently selected from the group consisting of H, C1-C6 alkyl, C1-C6 alkoxy, and C6-C12 aryl;

m is 0, 1, or 2; and # represents a bonding position.

In an embodiment of the compound of the present disclosure, $D_1$ and $D_2$ are each independently a group represented by:

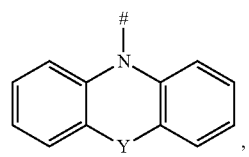

and Y is selected from the group consisting of O, S, N-$r_1$, and C($r_{02}r_{03}$), and $r_0$, $r_{01}$, $r_{02}$ and $r_{03}$ are each independently selected from the group consisting of H, C1-C6 alkyl, C1-C6 alkoxy, and C6-C12 aryl; and # represents a bonding position.

In an embodiment of the compound of the present disclosure, $D_1$ and $D_2$ are each independently any one of the following groups:

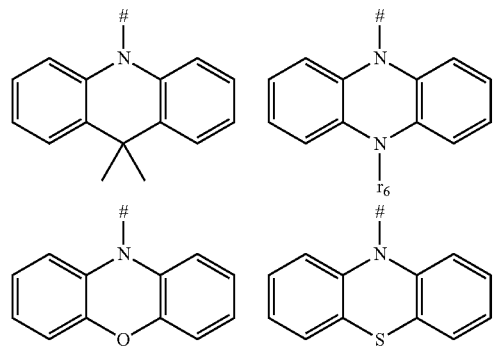

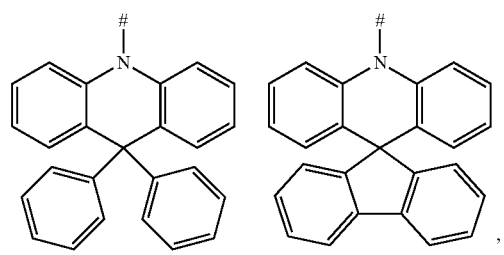
and $r_6$ is selected from the group consisting of H, C1-C6 alkyl, C1-C6 alkoxy, and C6-C12 aryl; and
# represents a bonding position.
In an embodiment of the compound of the present disclosure, the compound is any one of the following compounds:
A001
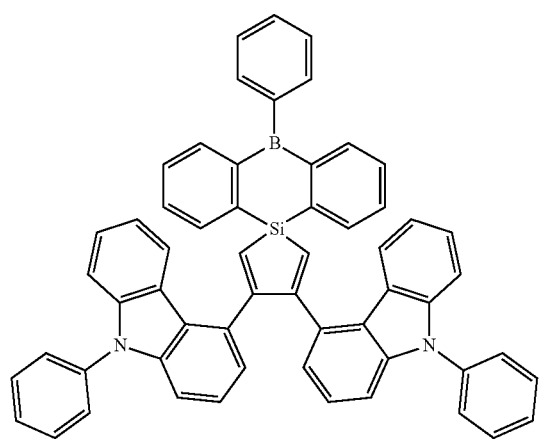
A002
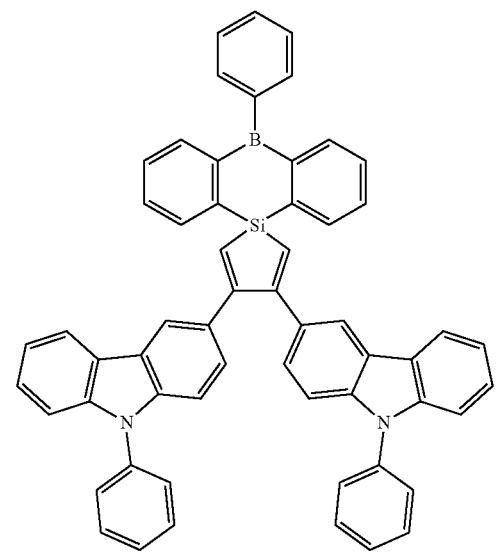
A003
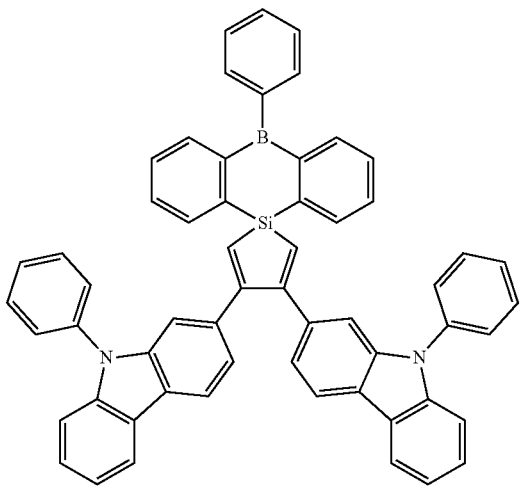
A004
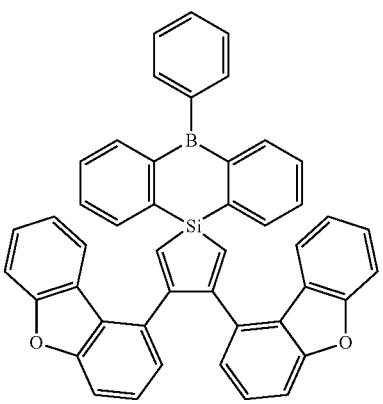
A005
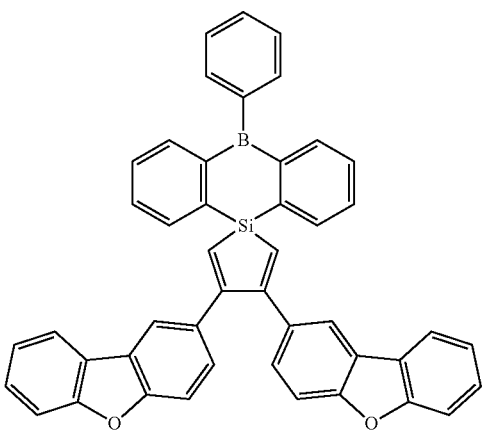

A006
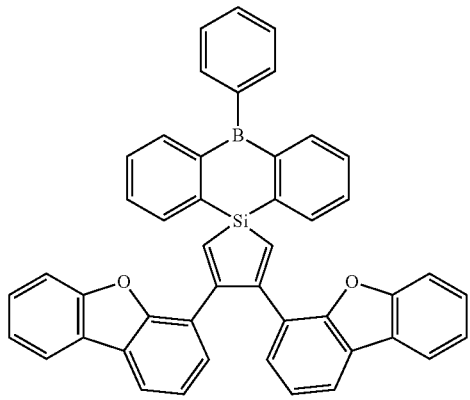
A007
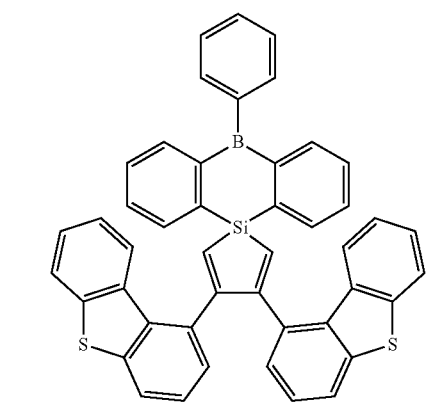
A008
A009
A010
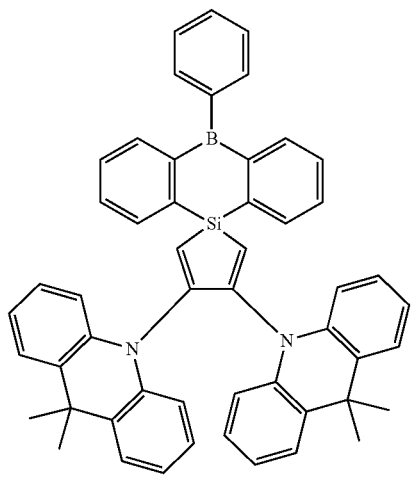
A011
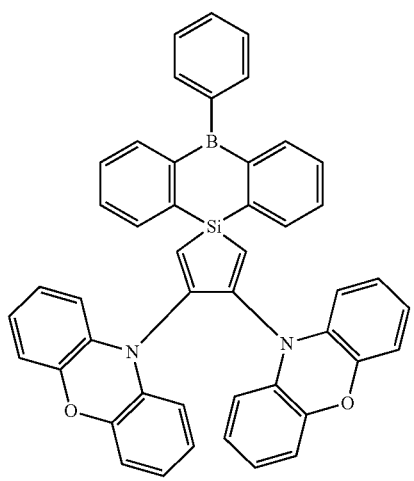
A012
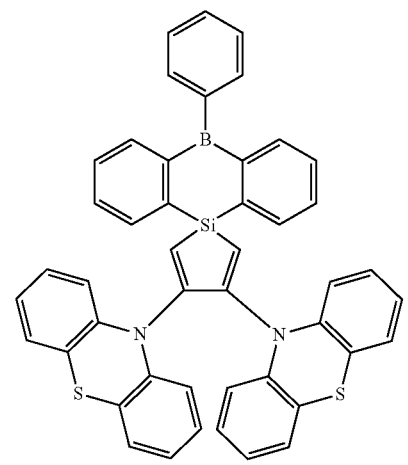

-continued
A013
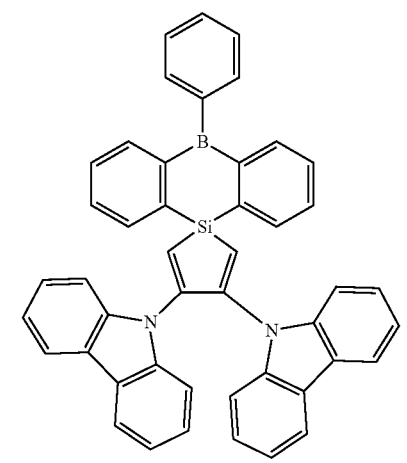
A014
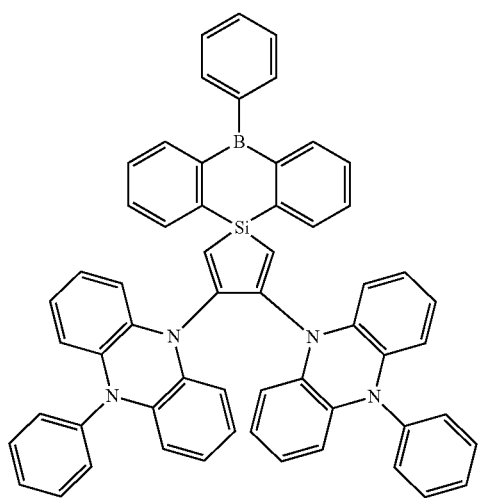
A015
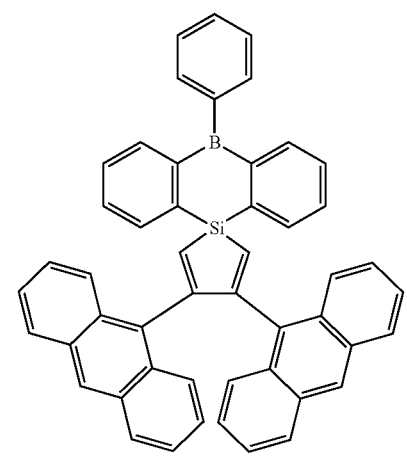
-continued
A016
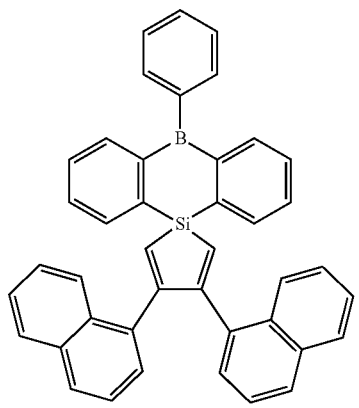
A017
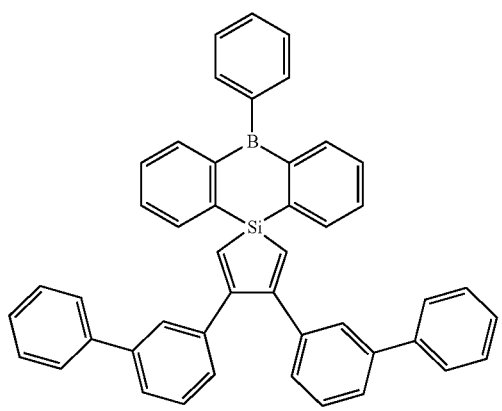
A018
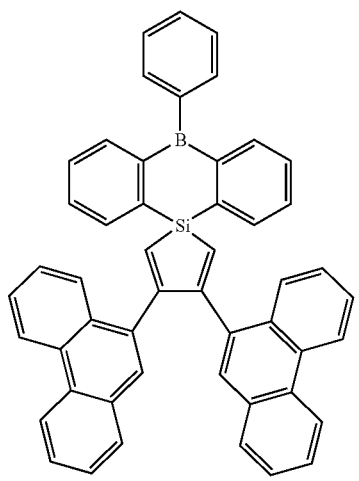

A019
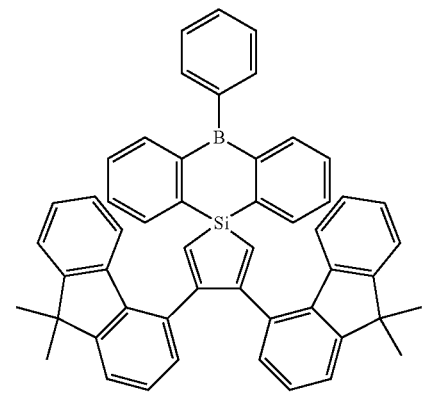
A020
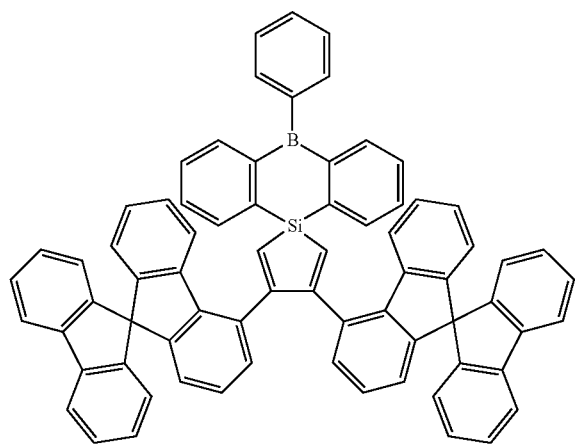
A021
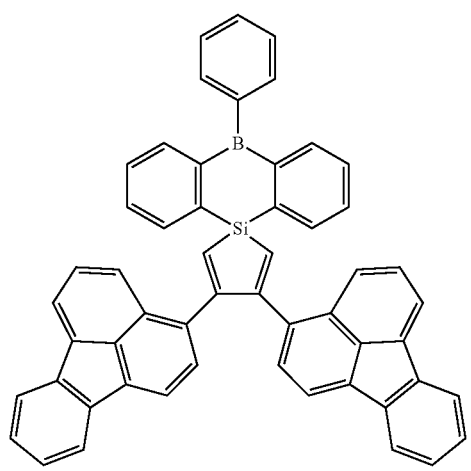
A022
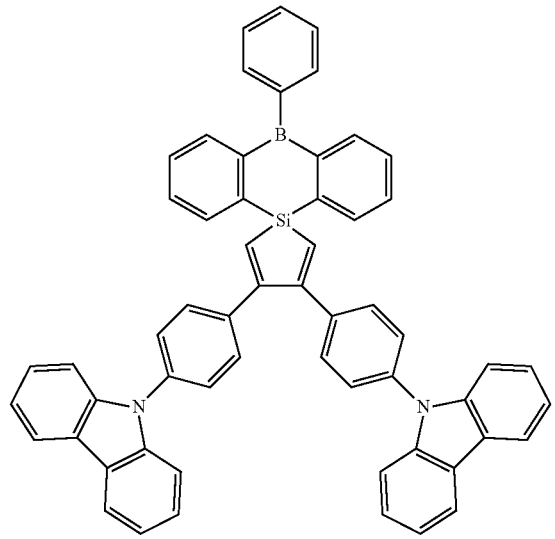
A023
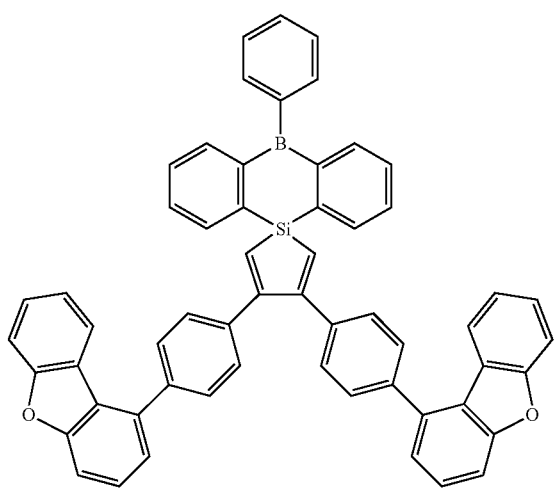
A024
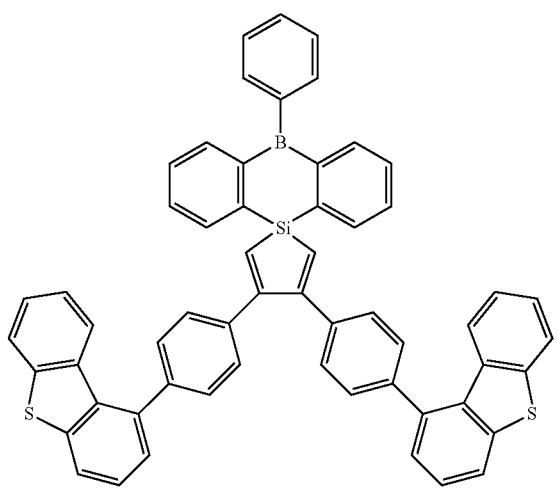

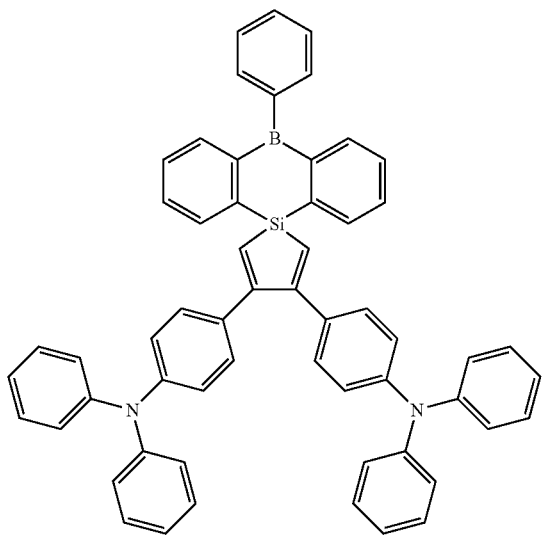
A025
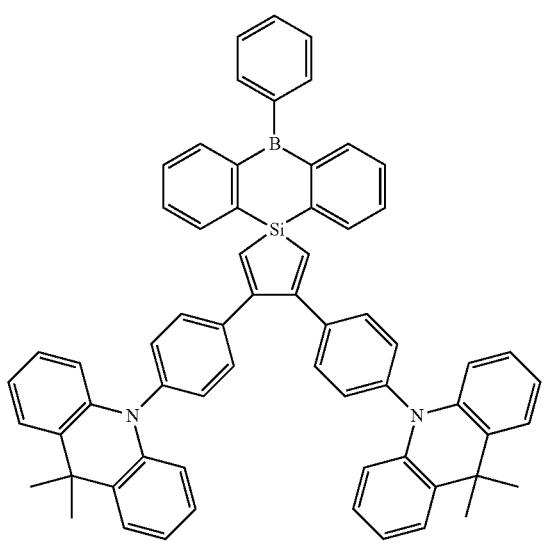
A026
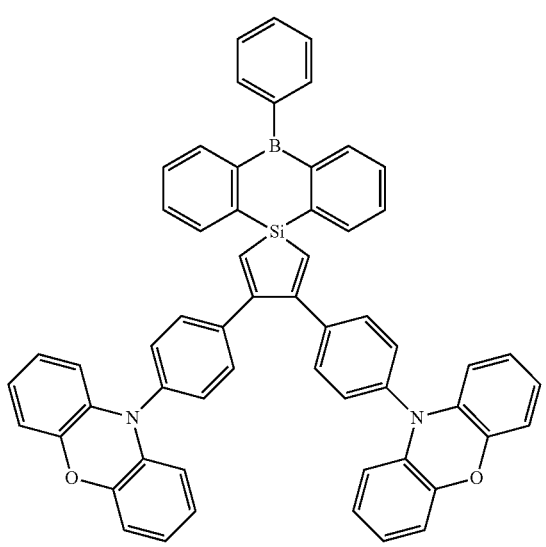
A027
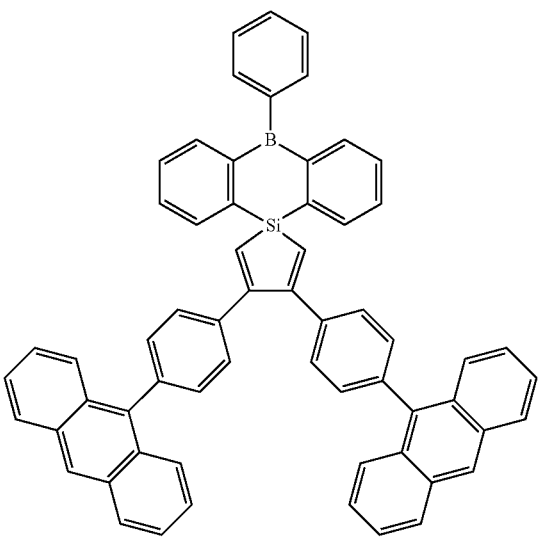
A028
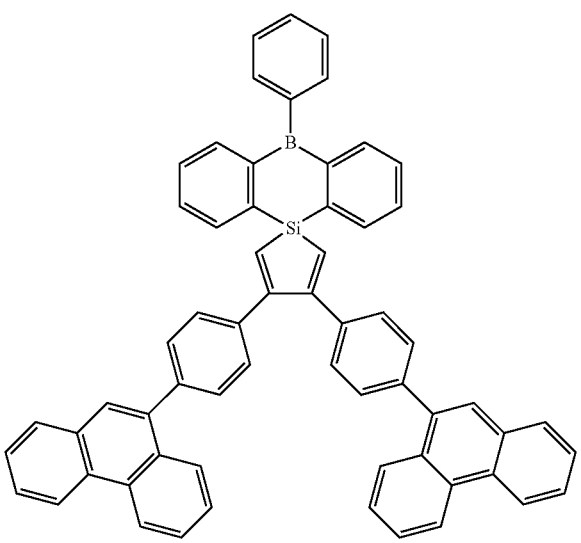
A029
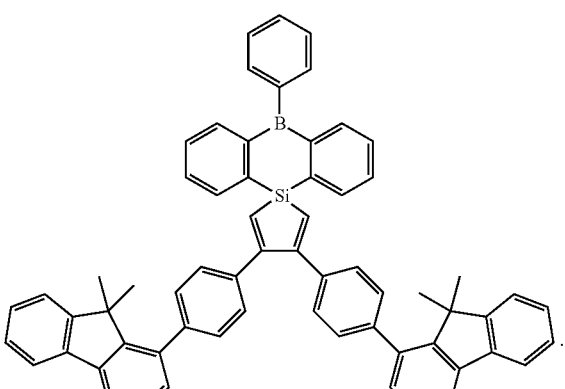
A030
In one embodiment, the present disclosure provides a display panel including an organic light-emitting device. The organic light-emitting device includes an anode, a cathode, a light-emitting layer disposed between the anode and the cathode, and a light-emitting host material or a light-emitting guest material of the light-emitting layer is one or more compounds of the present disclosure.

In an embodiment of the display panel of the present disclosure, the organic light-emitting device further includes an electron transmission layer, and a electron transmission material of the electron transmission layer is one or more compounds of the present disclosure.

The present disclosure further provides preparation methods of exemplary compounds A001, A006, A018, A020, and A026, as described in the following examples 1-5.

Example 1

Synthesis of Compound A001

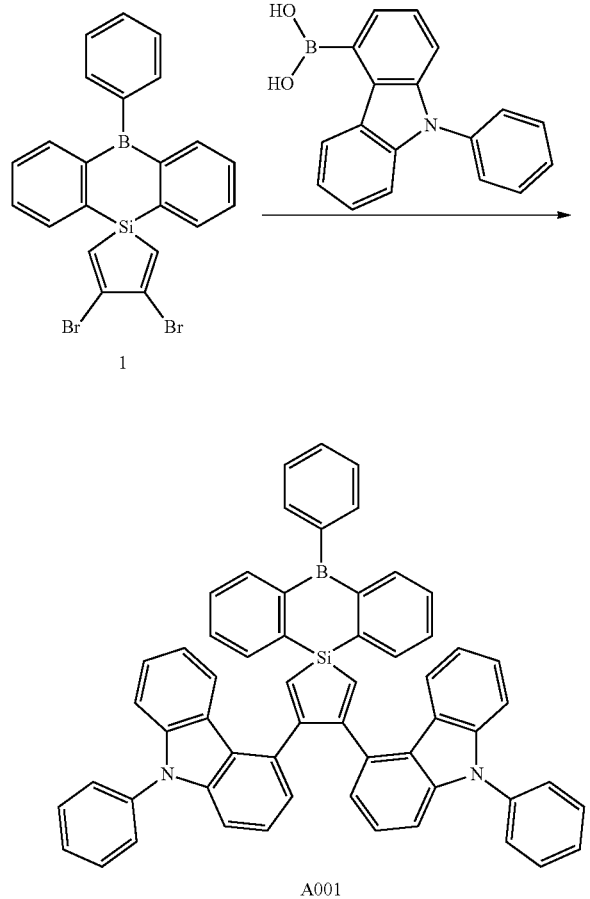 [SMILES: BrC1=C[Si]2(C=C1Br)c1ccccc1B(c1ccccc1)c1ccccc12 ; OB(O)c1cccc2c1c1ccccc1n2-c1ccccc1 ; C1=C(c2cccc3c2c2ccccc2n3-c2ccccc2)C(c2cccc3c2c2ccccc2n3-c2ccccc2)=C[Si]12c1ccccc1B(c1ccccc1)c1ccccc12 ; "A001"]

A001

In a 250 mL round bottom flask, reagent 1 (12 mmol), 4-boric acid-9-phenyl-carbazole (25 mmol) and Na$_2$CO$_3$ (80 mmol) were added to a mixed solvent of toluene/EtOH (absolute ethanol)/H$_2$O (75/25/50, mL) to form a solution mixture. Then, Pd(PPh$_3$)$_4$ (0.48 mmol) was added to the solution mixture, and the reaction was performed with reflux under nitrogen atmosphere for 20 hours to obtain an intermediate. The obtained intermediate was cooled to room temperature and added with water, then filtered through a diatomite pad while being extracted with dichloromethane, then washed with water, dried over anhydrous magnesium sulfate, filtered and evaporated, and finally purified through silica gel column chromatography to obtain product A001.

Characterization Results of Compound A001:

Elemental analysis results: C$_{58}$H$_{39}$BN$_2$Si, theoretical: C, 86.77; H, 4.90; B, 1.35; N, 3.49; Si, 3.50; measured: C, 86.77; H, 4.93; B, 1.34; N, 3.47; Si, 3.50.

ESI-MS(m/z)(M+) of liquid chromatography-mass spectrometry analysis: theoretical: 802.30, measured: 802.84.

Example 2

Synthesis of Compound A006

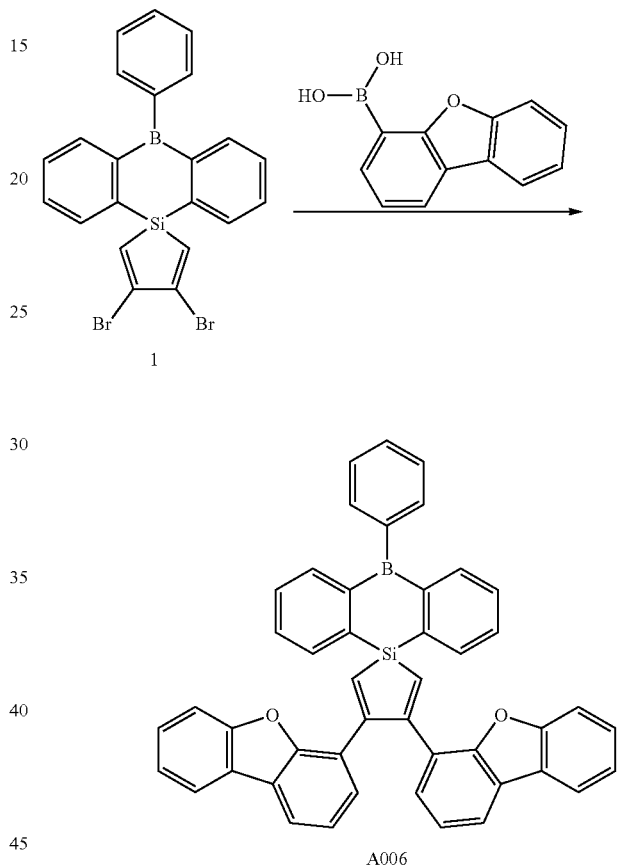

A006

In a 250 mL round bottom flask, reagent 1 (12 mmol), 4-boronic acid-dibenzofuran (25 mmol) and Na$_2$CO$_3$ (80 mmol) were added to a mixed solvent of toluene/EtOH (absolute ethanol)/H$_2$O (75/25/50, mL) to form a solution mixture. Then, Pd(PPh$_3$)$_4$ (0.48 mmol) was added to the solution mixture, and the reaction was performed with reflux under nitrogen atmosphere for 20 hours to obtain an intermediate. The obtained intermediate was cooled to room temperature, added with water, then filtered through a diatomite pad while being extracted with dichloromethane, then washed with water, dried over anhydrous magnesium sulfate, filtered and evaporated, and finally purified through silica gel column chromatography to obtain product A006.

Characterization Results of Compound A006:

Elemental analysis results: C$_{46}$H$_{29}$BO$_2$Si, theoretical: C, 84.66; H, 4.48; B, 1.66; O, 4.90; Si, 4.30; measured: C, 84.66; H, 4.47; B, 1.66; O, 4.91; Si, 4.30.

ESI-MS(m/z)(M+) of liquid chromatography-mass spectrometry analysis: theoretical: 652.20; measured: 652.62.

Example 3

Synthesis of Compound A018

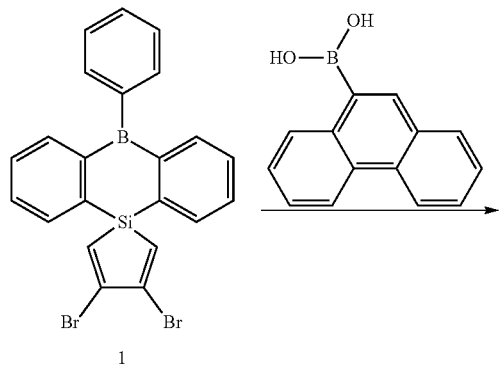

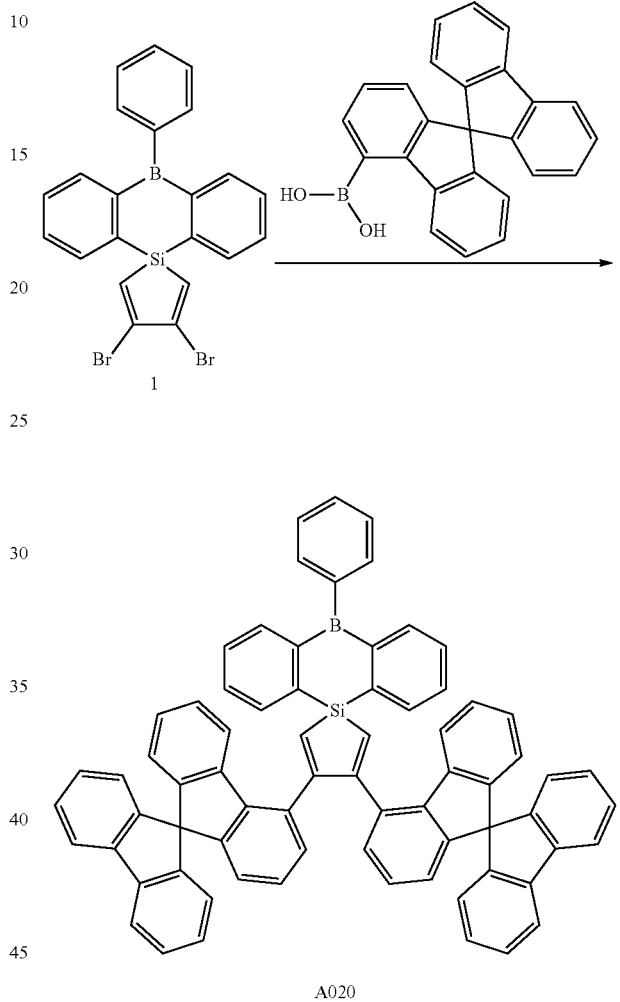

In a 250 mL round bottom flask, reagent 1 (12 mmol), 9-boric acid-phenanthrene (25 mmol) and Na$_2$CO$_3$ (80 mmol) were added to a mixed solvent of toluene/EtOH (absolute ethanol)/H$_2$O (75/25/50, mL) to form a solution mixture. Then Pd(PPh$_3$)$_4$ (0.48 mmol) was added to the solution mixture, and the reaction was performed with reflux under nitrogen atmosphere for 20 hours to obtain an intermediate. The obtained intermediate was cooled to room temperature, added with water, then filtered through a diatomite pad while being extracted with dichloromethane, then washed with water, dried over anhydrous magnesium sulfate, filtered and evaporated, and then purified through silica gel column chromatography to obtain product A018.

Characterization Results of Compound A018:

Elemental analysis results: C$_{50}$H$_{33}$BSi, theoretical: C, 89.27; H, 4.94; B, 1.61; Si, 4.18; measured: C, 89.27; H, 4.92; B, 1.61; Si, 4.16.

ESI-MS(m/z)(M+) of liquid chromatography-mass spectrometry analysis: theoretical: 672.24, measured: 672.69.

Example 4

Synthesis of Compound A020

In a 250 mL round bottom flask, reagent 1 (12 mmol), 4-boric acid-spirofluorene (25 mmol) and Na$_2$CO$_3$ (80 mmol) were added to a mixed solvent of toluene/EtOH (absolute ethanol)/H$_2$O (75/25/50, mL) to form a solution mixture. Then Pd(PPh$_3$)$_4$ (0.48 mmol) was added to the solution mixture, and the reaction was performed with reflux under nitrogen atmosphere for 20 hours to obtain an intermediate. The obtained intermediate was cooled to room temperature, added with water, then filtered through a diatomite pad while being extracted with dichloromethane, then washed with water, dried over anhydrous magnesium sulfate, filtered and evaporated, and then purified through silica gel column chromatography to obtain product A020.

Characterization Results of Compound A020:

Elemental analysis results: C$_{72}$H$_{45}$BSi, theoretical: C, 91.12; H, 4.78; B, 1.14; Si, 2.96; measured: C, 91.12; H, 4.76; B, 1.15; Si, 2.97.

ESI-MS(m/z)(M+) of liquid chromatography-mass spectrometry analysis: theoretical: 948.34, measured: 949.02.

Example 5

Synthesis of Compound A026

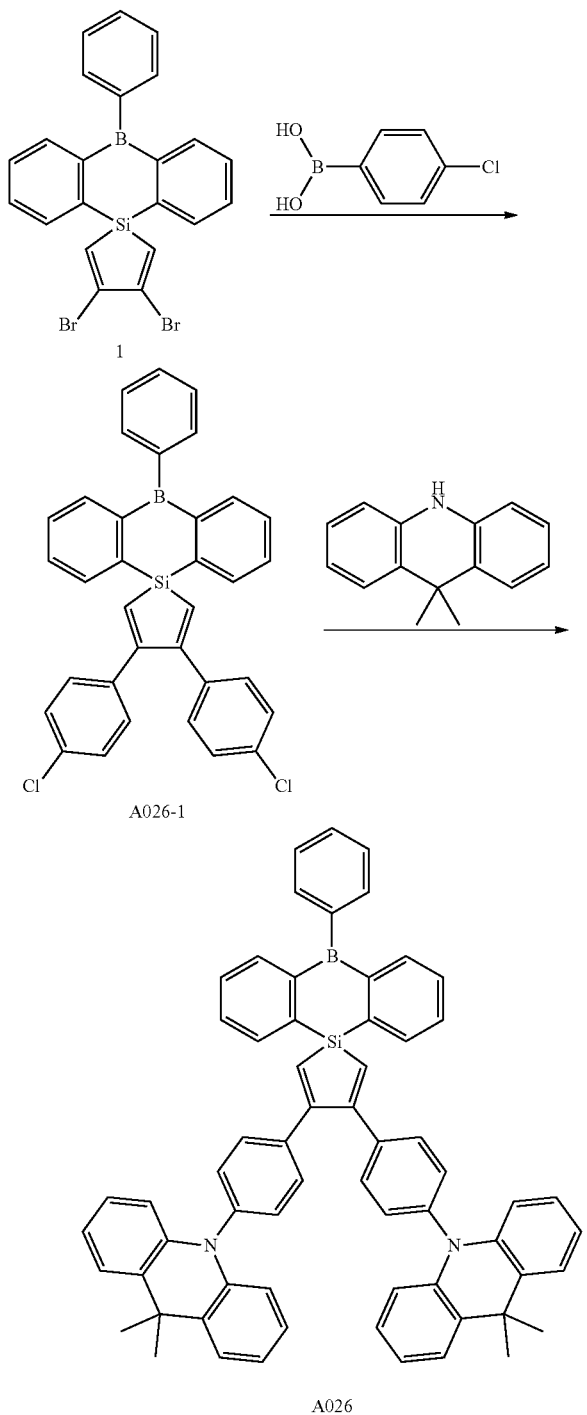

In a 250 mL round bottom flask, reagent 1 (12 mmol), (4-chlorophenyl)boronic acid (25 mmol) and Na$_2$CO$_3$ (80 mmol) were added to a mixed solvent of toluene/EtOH (absolute ethanol)/H$_2$O (75/25/50, mL) to form a solution mixture. Then Pd(PPh$_3$)$_4$ (0.48 mmol) was added to the solution mixture, and the reaction was performed with reflux under nitrogen atmosphere for 20 hours to obtain an intermediate. The obtained intermediate was cooled to room temperature, added with water, then filtered through a diatomite pad while being extracted with dichloromethane, then washed with water, dried over anhydrous magnesium sulfate, filtered and evaporated, and then purified through silica gel column chromatography to obtain an intermediate product A026-1.

In a 250 mL round bottom flask, the intermediate product A026-1 (12 mmol), 9,9-dimethyl-9,10-dihydroacridine (25 mmol), copper iodide (15 mmol), potassium tert-butoxide (65 mmol) and 1,2-diaminocyclohexane (12 mmol) were added to dry 1,4-dioxane (100 mL), and the reaction was performed with reflux under nitrogen atmosphere for 48 hours to obtain an intermediate. The obtained intermediate was cooled to room temperature, added with water, then filtered through a diatomite pad while being extracted with dichloromethane, then washed with water, dried over anhydrous magnesium sulfate, filtered and evaporated, and then purified through silica gel column chromatography to obtain product A026.

Characterization Results of Compound A026:

Elemental analysis results: C$_{64}$H$_{51}$BN$_2$Si, theoretical: C, 86.66; H, 5.80; B, 1.22; N, 3.16; Si, 3.17; measured: C, 86.66; H, 5.83; B, 1.23; N, 3.16; Si, 3.15.

ESI-MS(m/z)(M+) of liquid chromatography-mass spectrometry analysis: theoretical: 886.39, measured: 887.00.

Simulation Calculation of Energy Level of Compounds:

With respect to compounds provided in the examples of the present disclosure, the distribution of the molecular frontier orbitals HUMO and LUMO was optimized and calculated by applying a density functional theory (DFT) and using a Gaussian 09 software with B3LYP/6-31G calculation level. The lowest triplet energy level En of the compound molecule was calculated based on the time-dependent density functional theory (TDDFT) simulation. The results are shown in Table 1.

Comparative Compound 1

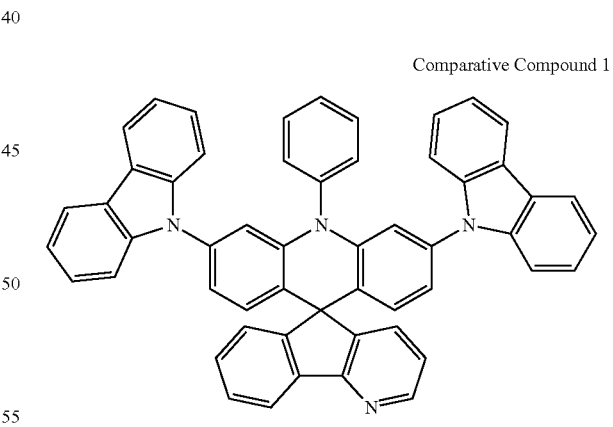

TABLE 1

| Compound | HOMO (ev) | LUMO (ev) | E$_g$ (ev) | E$_{T1}$ (ev) |
|---|---|---|---|---|
| A001 | −5.24 | −1.62 | 3.52 | 2.18 |
| A006 | −5.36 | −1.66 | 3.60 | 2.20 |
| A018 | −5.30 | −1.65 | 3.55 | 2.19 |
| A020 | −5.22 | −1.68 | 3.44 | 2.22 |

TABLE 1-continued

| Compound | HOMO (ev) | LUMO (ev) | $E_g$ (ev) | $E_{T1}$ (ev) |
|---|---|---|---|---|
| A026 | −5.20 | −1.69 | 3.41 | 2.23 |
| Comparative Compound 1 | −5.21 | −1.83 | 3.38 | 2.14 |

In Table 1, $E_g$=LUMO-HOMO.

From Table 1, it is obvious that the compounds A001, A006, A018, A020 and A026 according to the present disclosure have lower LUMO energy levels (higher than −1.70 eV) than the comparative compound 1, and the compounds of the present disclosure can be matched with the materials of the adjacent layers; and they have suitable HOMO (about 5.25 eV) for effectively transferring the holes injected from the anode. Therefore, the light-emitting efficiency can be maximized after electrons and holes are combined on the guest material in the light-emitting layer.

Device Example 1

Figure 2:
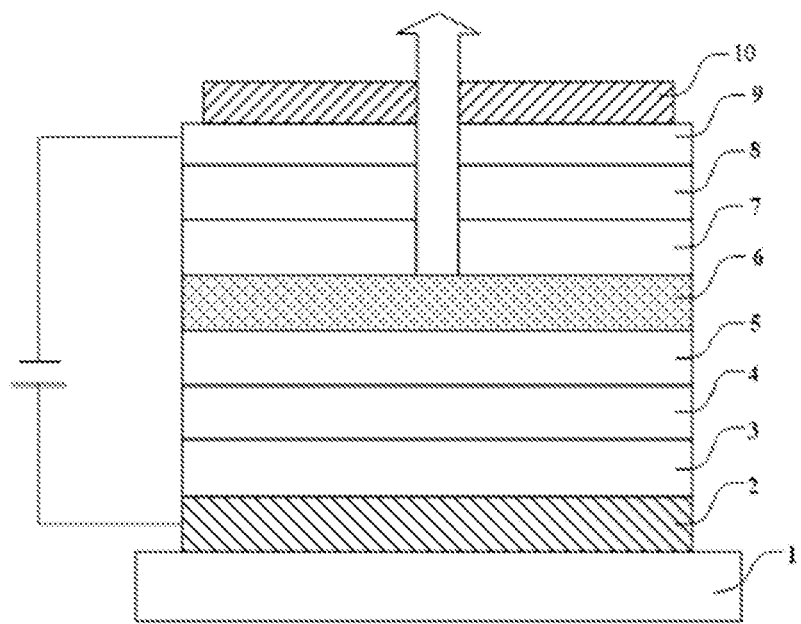
FIG. 2 is a structural schematic diagram of an OLED device provided by the present disclosure.

This example provides an organic light-emitting device (an OLED device), which includes a substrate 1, an anode 2, a hole injection layer 3, a first hole transmission layer 4, a second hole transmission layer 5, a light-emitting layer 6, a hole blocking layer 7, a hole transmission layer 8, a cathode 9 and a capping layer 10, as shown in FIG. 2.

The OLED device was prepared through the following preparation steps:

1) A glass substrate 1 with an indium tin oxide (ITO) anode 2 (thickness of 15 nm) was cut into a size of 50 mm×50 mm×0.7 mm, ultrasonically processed respectively in isopropanol and deionized water for 30 minutes, and then exposed to ozone for about 10 min for cleaning, and the cleaned glass substrate was installed on a vacuum deposition device;

2) A hole injection layer material compound b and a P-doping material compound a (in a doping mass ratio of 3%) were co-deposited under vacuum on the ITO anode layer 2 to form a hole injection layer 3 with a thickness of 5 nm;

3) A hole transmission material compound b was vacuum-deposited on the hole injection layer 3 to form a first hole transmission layer 4 with a thickness of 100 nm;

4) A hole transmission material compound d was vacuum-deposited on the first hole transmission layer 4 to form a second hole transmission layer 5 with a thickness of 5 nm;

5) Compound A001 according to the present disclosure and a doping material compound (in a doping mass ratio of 3%) were co-deposited under vacuum on the second hole transmission layer 5 to form a light-emitting layer 6 with a thickness of 30 nm;

6) Compound f was vacuum-deposited on the light-emitting layer 6 to form a hole blocking layer 7 with a thickness of 30 nm;

7) Compound g and an N-doping material compound h (in a doping mass ratio of 1:1) were co-deposited under vacuum on the hole blocking layer 7 to form a hole transmission layer 8 with a thickness of 5 nm;

8) A magnesium-silver electrode with a thickness of 10 nm was vacuum-deposited on the hole transmission layer 8 to serve as a cathode 9, in which a mass ratio of Mg to Ag was 1:9; and 9) Compound i was vacuum-deposited on the cathode to form a capping layer (CPL) 10 with a thickness of 100 nm.

The compounds used in the above preparation steps of the OLED device are illustrated as below:

Compound a

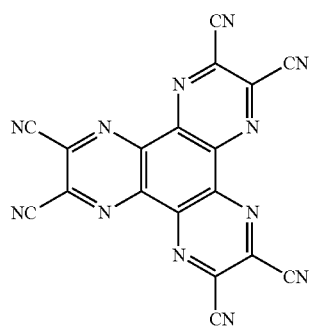

Compound b

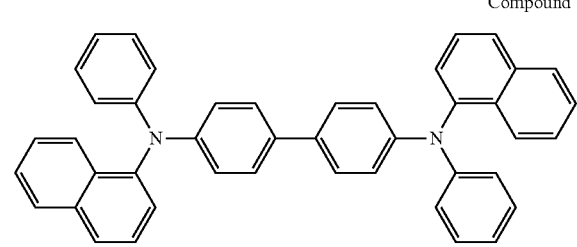

Compound d

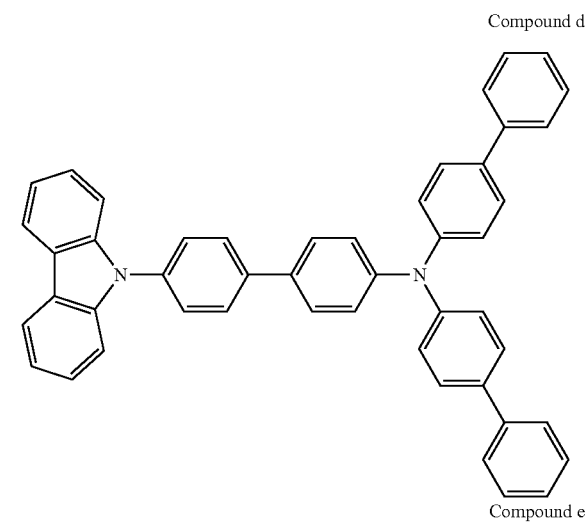

Compound e

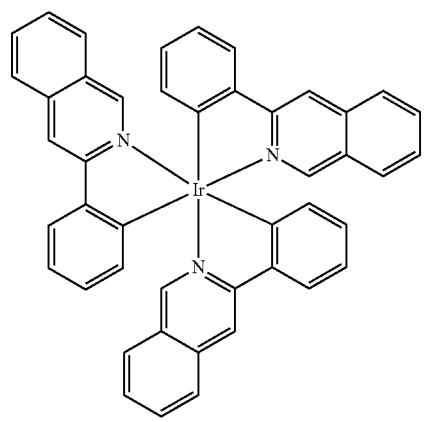

Compound f

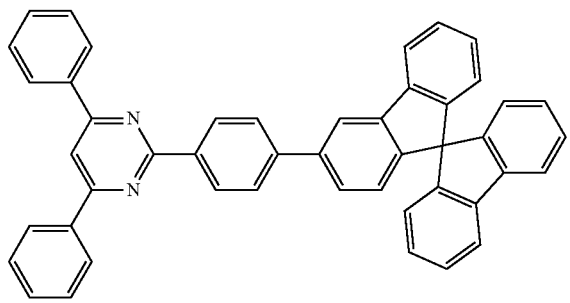

Compound g

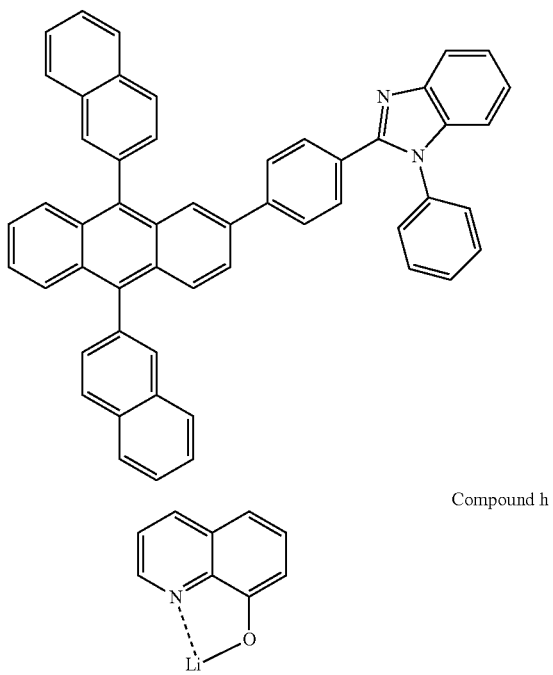

Compound h

Compound i

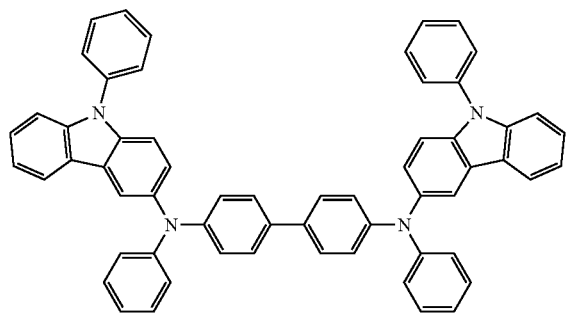

Device Example 2

The preparation steps of the OLED device in Device Example 2 differ from those of Device Example 1 only in that compound A001 in step 5) was replaced with compound A006.

Device Example 3

The preparation steps of the OLED device in Device Example 3 differ from those of Device Example 1 only in that compound A001 in step 5) was replaced with compound A018.

Device Example 4

The preparation steps of the OLED device in Device Example 4 differ from those of Device Example 1 only in that compound A001 in step 5) was replaced with compound A020.

Device Example 5

The preparation steps of the OLED device in Device Example 2 differ from those of Device Example 1 only in that compound A001 in step 5) was replaced with compound A026.

Comparative Device Example 1

The preparation steps of the OLED device in Device Example 2 differ from those of Device Example 1 only in that compound A001 in step 5) was replaced with compound 1.

Performance Evaluation of OLED Devices:

The currents of the OLED device at different voltages were tested with Keithley 2365A digital nanovoltmeter, and then the current densities of the OLED device at the different voltages were calculated through dividing the currents by the light-emitting area. The brightness and radiation energy flux density of individual OLED device under different voltages were tested with Konicaminolta CS-2000 spectroradiometer. The operation voltage and current efficiency CE (cd/A) at the same current density (10 mA/cm$^2$) were obtained based on the current densities and brightness of the OLED device at the different voltages. $V_{on}$ was a turn-on voltage when the brightness was 1 cd/m$^2$. The lifetime LT95 is the measured time duration during which the brightness of the OLED device reached 95% of the initial brightness (under s test condition of 50 mA/cm$^2$).

TABLE 2

| OLED device | Host material | $V_{on}$(V) | CE(cd/A) | Lifetime LT95(h) |
|---|---|---|---|---|
| Device Example 1 | Compound A001 | 3.84 | 44.6 | 140 |
| Device Example 2 | Compound A006 | 3.86 | 45.0 | 142 |
| Device Example 3 | Compound A018 | 3.81 | 44.8 | 143 |
| Device Example 4 | Compound A020 | 3.85 | 44.7 | 141 |
| Device Example 5 | Compound A026 | 3.84 | 44.5 | 142 |
| Comparative Device Example 1 | Comparative Compound 1 | 4.05 | 40.8 | 130 |

It can be seen from Table 2 that, compared to comparative device example 1, the device examples 1 to 5 have lower operating voltage, higher current efficiency, and longer device life, which are increased by about 4.9%, about 9.4%, about 8.5%, respectively, which is mainly attributed to the lower LUMO energy level (greater than −1.70 eV) of the materials of the present disclosure and the matching thereof to the materials of the adjacent layers. In addition, the device lifetime is prolonged due to the twisted rigid structure and higher thermal stability of the compounds according to the present disclosure.

Figure 3:
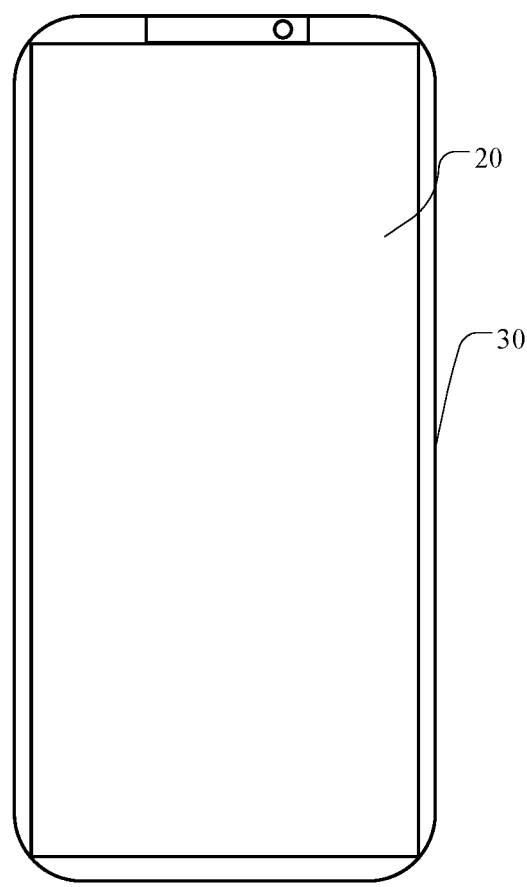
FIG. 3 is a schematic diagram of a display apparatus according to an embodiment of the present disclosure.

In the present disclosure, the organic light-emitting device can be used in the organic light-emitting display apparatus such as a mobile phone display, a computer display, a TV display, a smart watch display, a smart car display panel, VR or AR helmet display, and displays of various smart devices, etc. FIG. 3 is a schematic diagram of a display device according to an embodiment of the present disclosure. In FIG. 3, a mobile phone display panel is denoted with 20, and a display apparatus is denoted with 30.

What is claimed is:

1. A compound having a structure represented by formula 1:

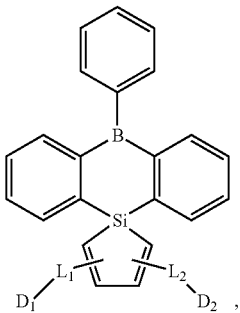

formula 1 wherein $L_1$ and $L_2$ are each independently selected from the group consisting of a single bond, a C6-C30 arylene, a C6-C30 fused arylene, a C4-C30 heteroarylene, and a C4-C30 fused heteroarylene; and $D_1$ and $D_2$ are each independently selected from the group consisting of a substituted or unsubstituted C6-C60 aryl, a substituted or unsubstituted C4-C60 heteroaryl, a substituted or unsubstituted C10-C60 fused aryl, a substituted or unsubstituted C8-C30 fused heteroaryl, and a substituted or unsubstituted diphenylamino.

2. The compound according to claim 1, wherein $L_1$ and $L_2$ are each independently any one of the following groups:

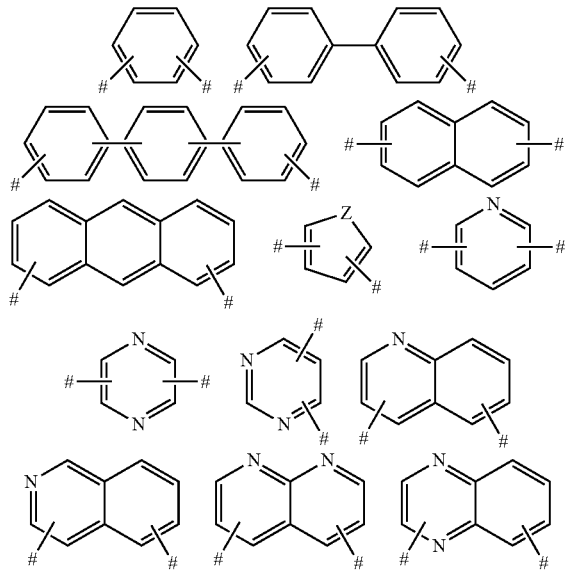

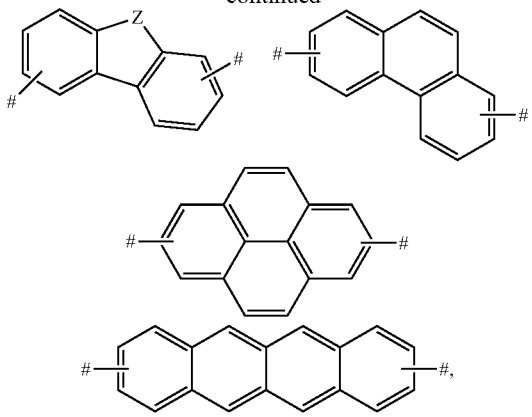

wherein Z is selected from the group consisting of O, S, and NH; and # represents a bonding position.

3. The compound according to claim 1, wherein $L_1$ and $L_2$ are identical.

4. The compound according to claim 1, wherein $D_1$ and $D_2$ are identical.

5. The compound according to claim 1, wherein $D_1$ and $D_2$ are each independently selected from the group consisting of a substituted or unsubstituted phenyl, a substituted or unsubstituted biphenyl, a substituted or unsubstituted naphthyl, a substituted or unsubstituted anthracyl, a substituted or unsubstituted phenanthracyl, a substituted or unsubstituted acenaphthylenyl, a substituted or unsubstituted pyrenyl, a substituted or unsubstituted perylenyl, a substituted or unsubstituted fluorenyl, a substituted or unsubstituted spirobifluorenyl, a substituted or unsubstituted chrysenyl, a substituted or unsubstituted benzophenanthracyl, a substituted or unsubstituted benzoanthracyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, carbazolyl and a carbazole-derived group, acridinyl and an acridine-derived group, and diarylamino and a diarylamine-derived group.

6. The compound according to claim 2, wherein $D_1$ and $D_2$ are each independently selected from the group consisting of a substituted or unsubstituted phenyl, a substituted or unsubstituted biphenyl, a substituted or unsubstituted naphthyl, a substituted or unsubstituted anthracyl, a substituted or unsubstituted phenanthracyl, a substituted or unsubstituted acenaphthylenyl, a substituted or unsubstituted pyrenyl, a substituted or unsubstituted perylenyl, a substituted or unsubstituted fluorenyl, a substituted or unsubstituted spirobifluorenyl, a substituted or unsubstituted chrysenyl, a substituted or unsubstituted benzophenanthracyl, a substituted or unsubstituted benzoanthracyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, carbazolyl and a carbazole-derived group, acridinyl and an acridine-derived group, and diarylamino and a diarylamine-derived group.

7. The compound according to claim 1, wherein $D_1$ and $D_2$ are each independently a group represented by:

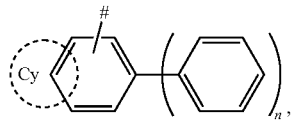

wherein Cy is present or absent, and
when Cy is present, Cy is an aromatic ring or an aromatic fused ring;
n is 0, 1, or 2; and
# represents a bonding position.

8. The compound according to claim 7,
wherein when Cy is present, Cy is a benzene ring, a naphthalene ring, or a phenanthrene ring.

9. The compound according to claim 1, wherein $D_1$ and $D_2$ are each independently any one of the following groups:

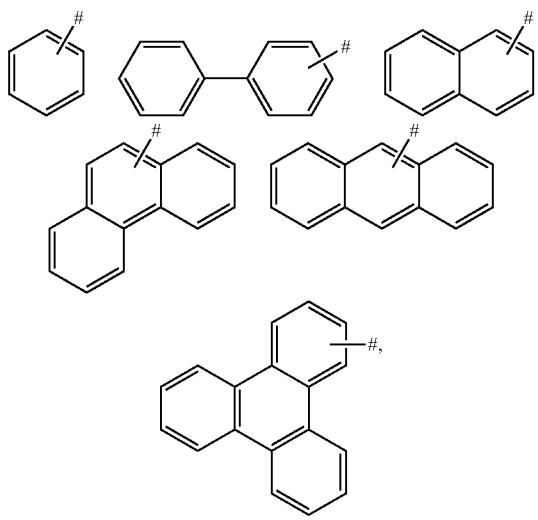

wherein # represents a bonding position.

10. The compound according to claim 1, wherein $D_1$ and $D_2$ are each independently a group represented by:

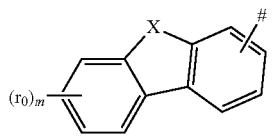

wherein X is selected from the group consisting of O, S, N-$r_{01}$ and C($r_{02}r_{03}$), and $r_0$, $r_{01}$, $r_{02}$ and $r_{03}$ are each independently selected from the group consisting of H, a C1-C6 alkyl, a C1-C6 alkoxy, and a C6-C12 aryl;
m is 0, 1, or 2; and
# represents a bonding position.

11. The compound according to 2, wherein $D_1$ and $D_2$ are each independently a group represented by:

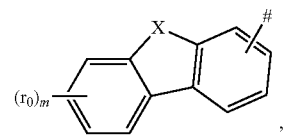

wherein X is selected from the group consisting of O, S, N-$r_{01}$ and C($r_{02}r_{03}$), and $r_0$, $r_{01}$, $r_{02}$ and $r_{03}$ are each independently selected from the group consisting of H, a C1-C6 alkyl, a C1-C6 alkoxy, and a C6-C12 aryl;
m is 0, 1, or 2; and
# represents a bonding position.

12. The compound according to claim 1, wherein $D_1$ and $D_2$ are each independently any one of the following groups:

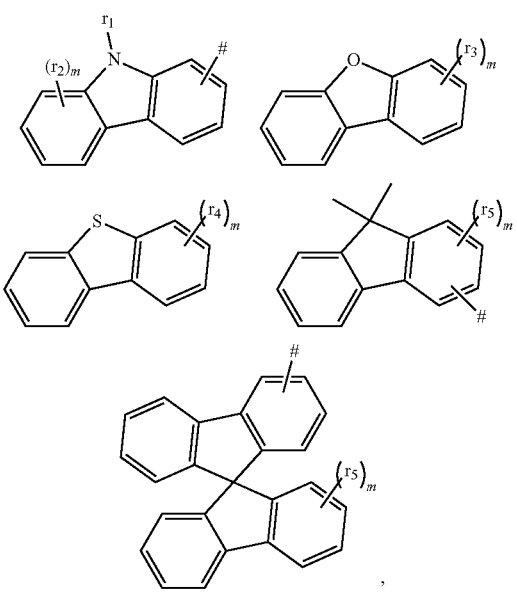

wherein $r_1$, $r_2$, $r_3$, $r_4$ and $r_5$ are each independently selected from the group consisting of H, a C1-C6 alkyl, a C1-C6 alkoxy, and a C6-C12 aryl;
m is 0, 1, or 2; and
# represents a bonding position.

13. The compound according to claim 2, wherein $D_1$ and $D_2$ are each independently any one of the following groups:

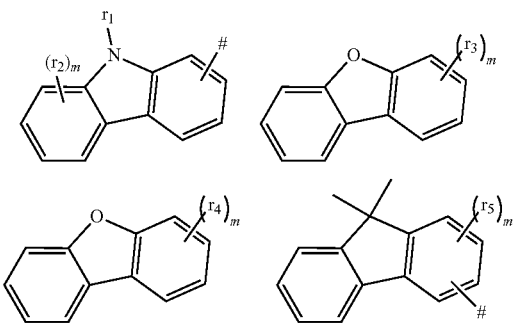

-continued

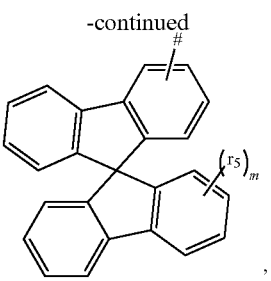

wherein $r_1$, $r_2$, $r_3$, $r_4$ and $r_5$ are each independently selected from the group consisting of H, a C1-C6 alkyl, a C1-C6 alkoxy, and a C6-C12 aryl;
m is 0, 1, or 2; and
# represents a bonding position.

14. The compound according to claim 1, wherein $D_1$ and $D_2$ are each independently a group represented by:

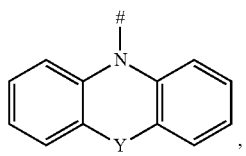

wherein Y is selected from the group consisting of O, S, N-$r_1$, and C($r_{02}r_{03}$), and $r_0$, $r_{01}$, $r_{02}$ and $r_{03}$ are each independently selected from the group consisting of H, a C1-C6 alkyl, a C1-C6 alkoxy, and a C6-C12 aryl; and
# represents a bonding position.

15. The compound according to claim 2, wherein $D_1$ and $D_2$ are each independently a group represented by:

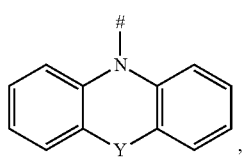

wherein Y is selected from the group consisting of O, S, N-$r_1$, and C($r_{02}r_{03}$), and $r_0$, $r_{01}$, $r_{02}$ and $r_{03}$ are each independently selected from the group consisting of H, a C1-C6 alkyl, a C1-C6 alkoxy, and a C6-C12 aryl; and
# represents a bonding position.

16. The compound according to claim 1, wherein $D_1$ and $D_2$ are each independently any one of the following groups:

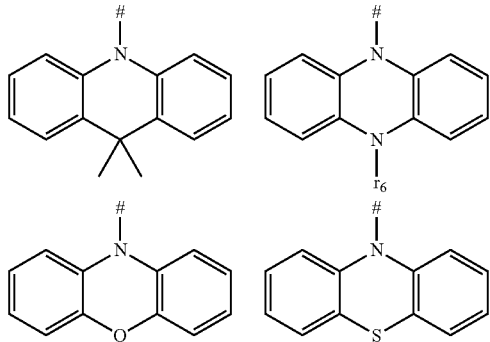

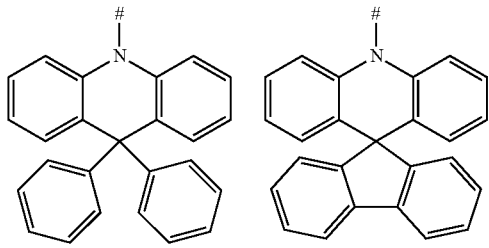

wherein $r_6$ is selected from the group consisting of H, a C1-C6 alkyl, a C1-C6 alkoxy, and a C6-C12 aryl; and
# represents a bonding position.

17. The compound according to claim 1, wherein the compound is any one of the following compounds:

A001

A002

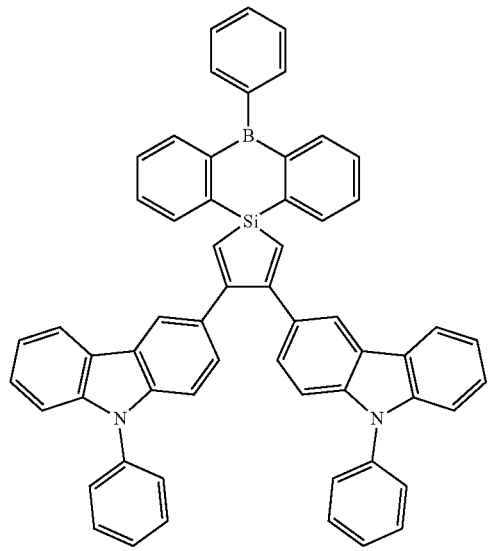

A003
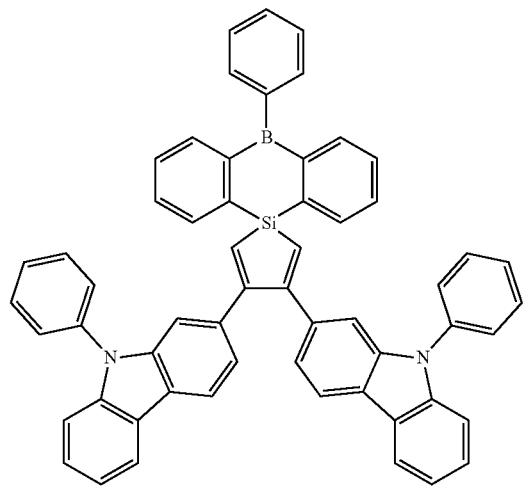
A004
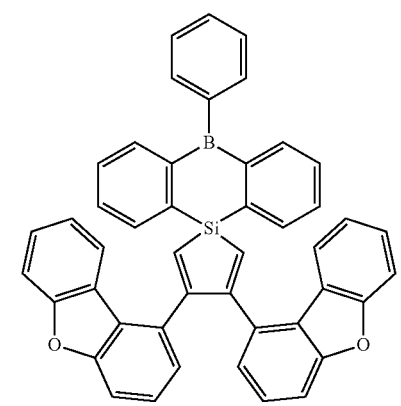
A005
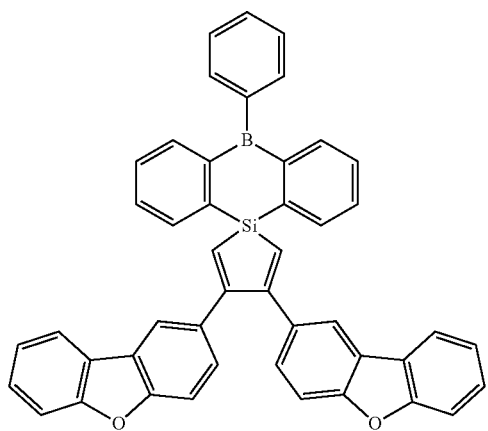
A006
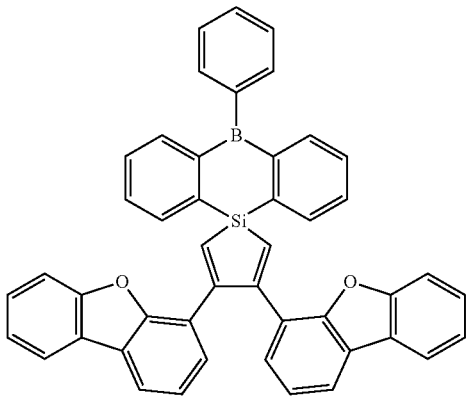
A007
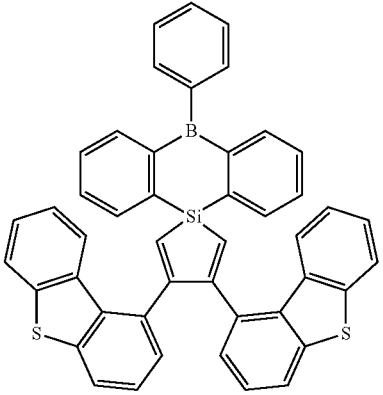
A008
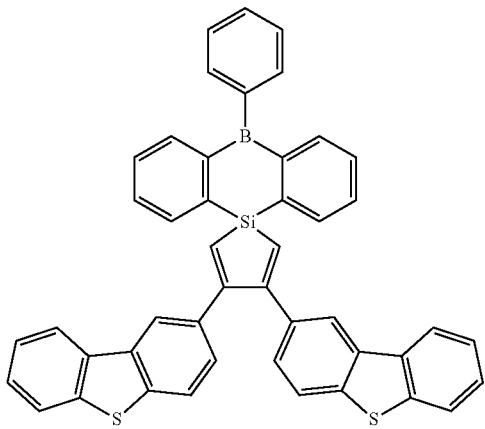
A009
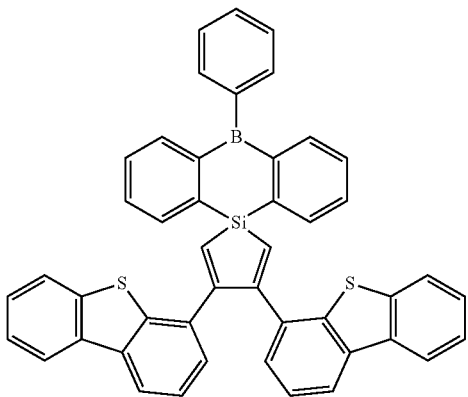

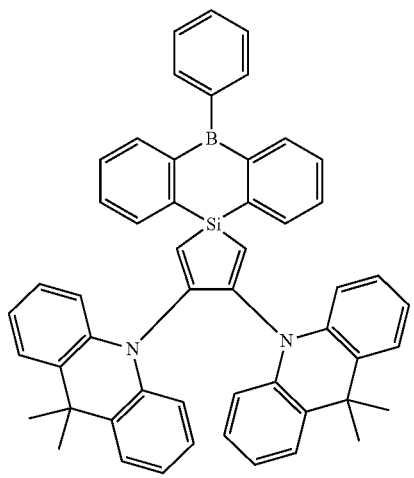
A010
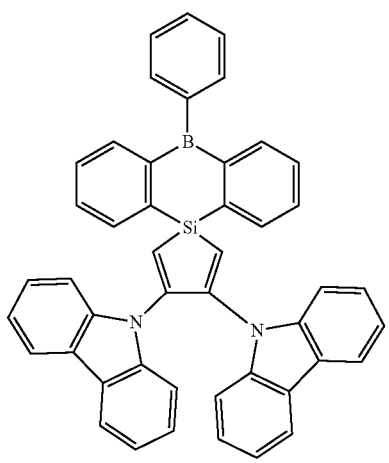
A013
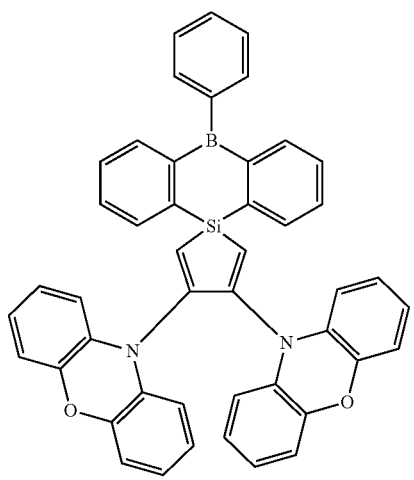
A011
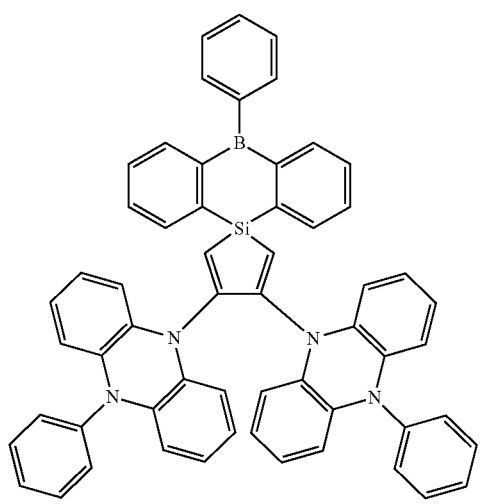
A014
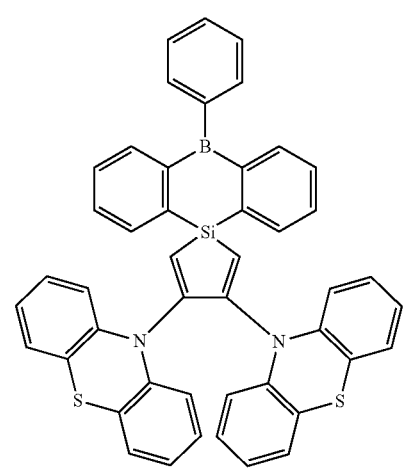
A012
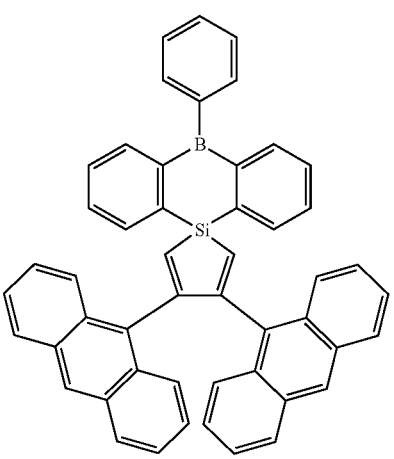
A015

A016
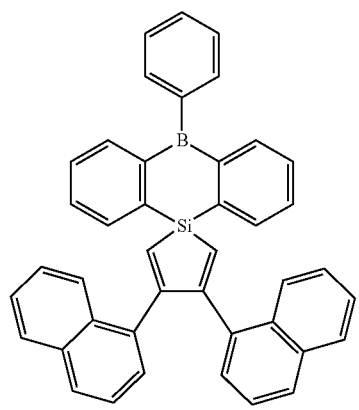
A017
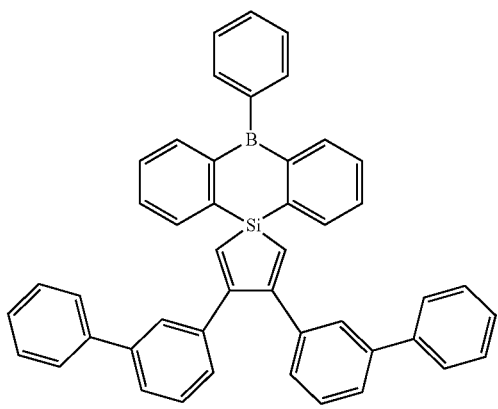
A018
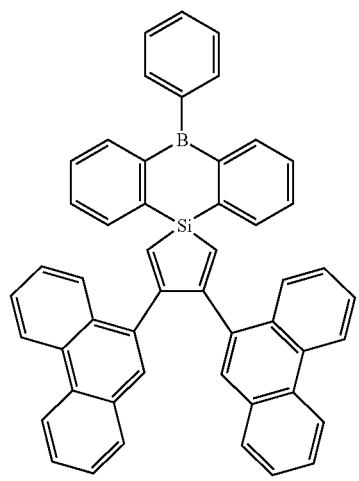
A019
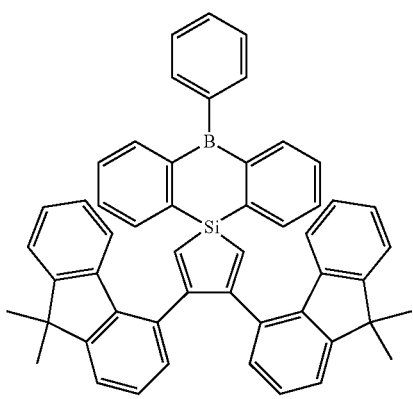
A020
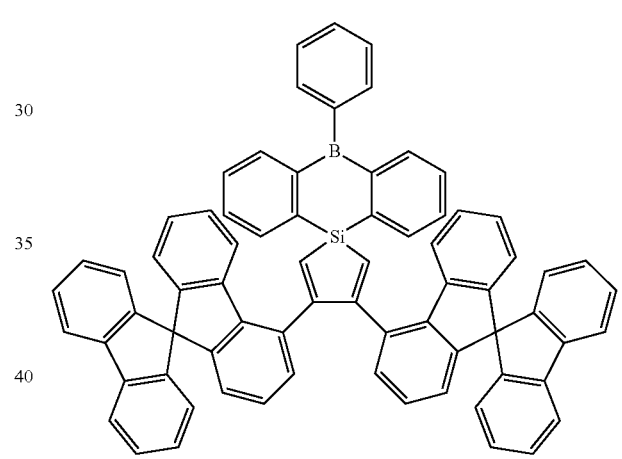
A021
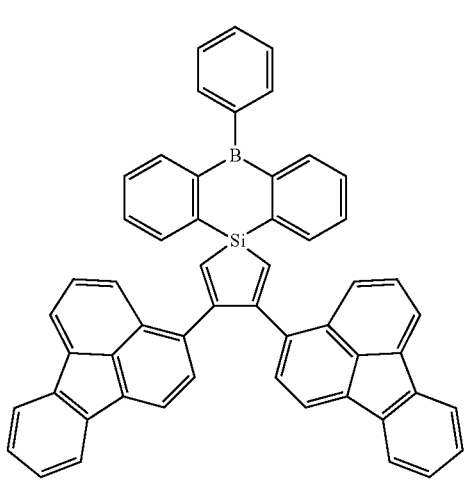

A022
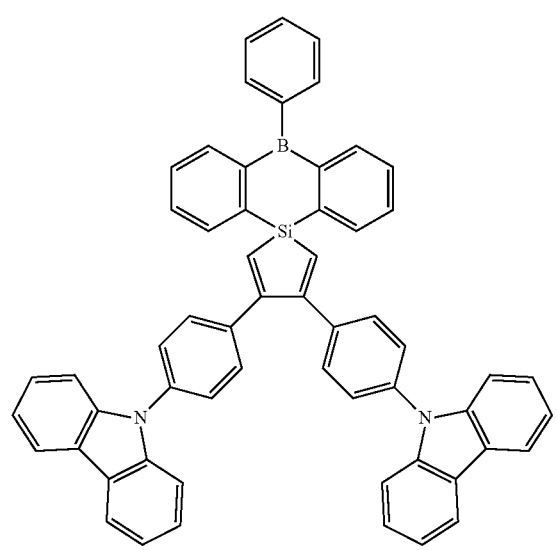
A023
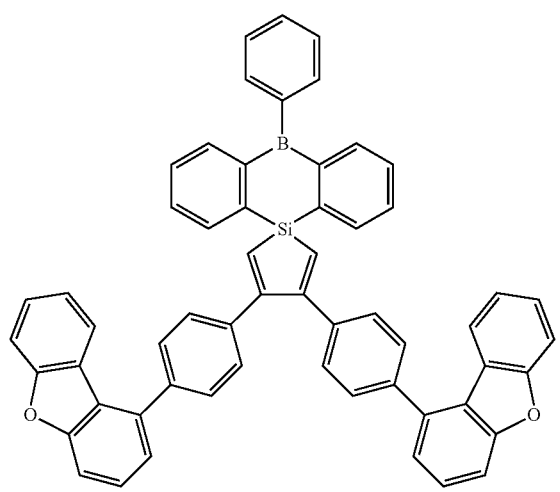
A024
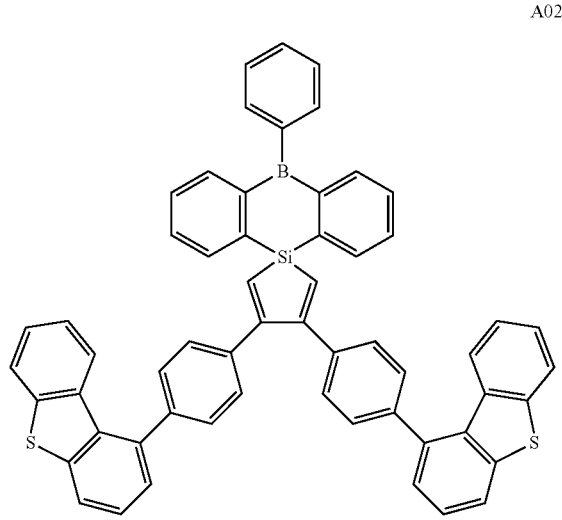
A025
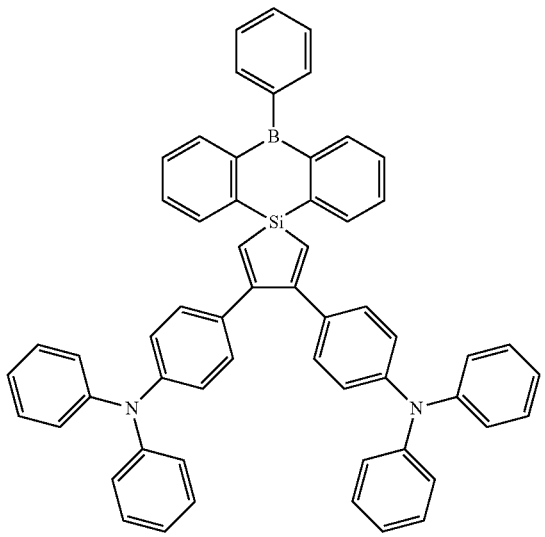
A026
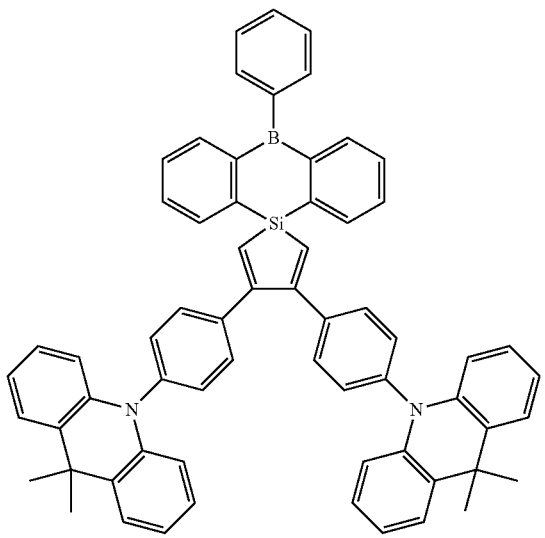
A027

A028

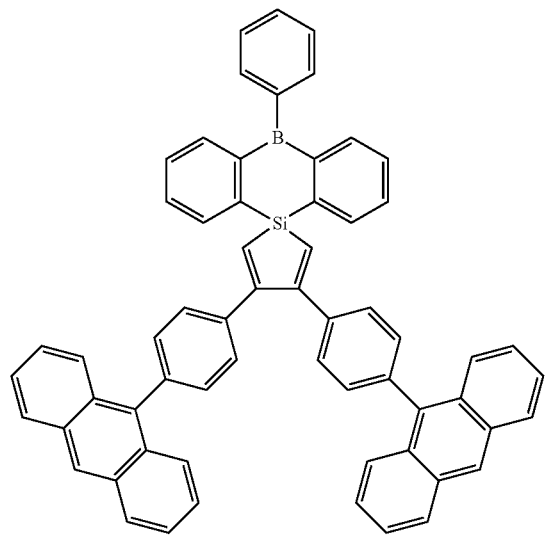

A029

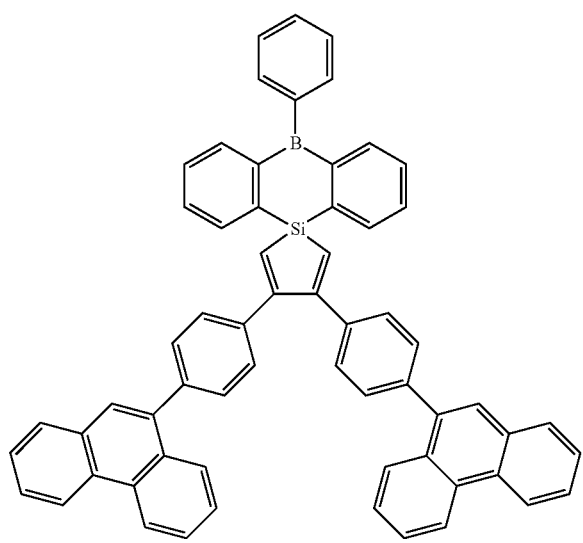

A030

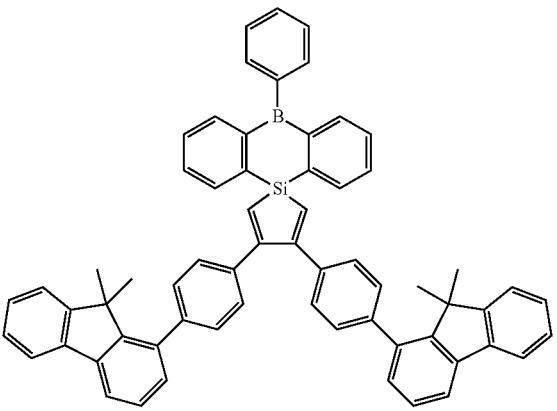

18. A display panel, comprising an organic light-emitting device,
wherein the organic light-emitting device comprises:
an anode;
a cathode; and
a light-emitting layer disposed between the anode and the cathode,
wherein a light-emitting host material or a light-emitting guest material of the light-emitting layer is one or more selected from the compounds according claim 1.

19. The display panel according to claim 18, wherein the organic light-emitting device further comprises an electron transmission layer, and
wherein the electron transmission layer comprises one or more electron transmission materials selected from the compounds according to claim 1.

20. A display apparatus, comprising the display panel according to claim 18.

* * * * *